United States Patent [19]
Hsieh et al.

[11] Patent Number: 5,790,048
[45] Date of Patent: Aug. 4, 1998

[54] CROSSPOINT SWITCH WITH BANK-SWITCHED MEMORY

[75] Inventors: Wen-Jai Hsieh; Chi-Song Horng; Chun Chiu Daniel Wong, all of Palo Alto; Gerchih Chou, San Jose; Shrikant Sathe, Saratoga; Kent Dahlgren, San Jose, all of Calif.

[73] Assignee: I-Cube, Inc., Campbell, Calif.

[21] Appl. No.: 961,545

[22] Filed: Oct. 30, 1997

Related U.S. Application Data

[63] Continuation of Ser. No. 516,318, Aug. 17, 1995, abandoned, which is a continuation-in-part of Ser. No. 333,524, Nov. 2, 1994, Pat. No. 5,465,056.

[51] Int. Cl.$^6$ .............................. H04Q 1/00; G06F 13/00
[52] U.S. Cl. ...................... 340/825.79; 340/825.8; 340/826; 340/827; 370/217; 370/218; 370/360; 370/363
[58] Field of Search .................... 340/825.79, 825.8, 340/826, 827; 370/217, 218, 360, 363

[56] References Cited

U.S. PATENT DOCUMENTS

| | | | |
|---|---|---|---|
| 4,973,956 | 11/1990 | Lin et al. | 340/825.86 |
| 5,126,734 | 6/1992 | Harrand | 340/825.9 |
| 5,226,125 | 7/1993 | Balmer et al. | 395/325 |
| 5,282,271 | 1/1994 | Hsieh et al. | 395/275 |
| 5,428,750 | 6/1995 | Hsieh et al. | 395/275 |
| 5,428,800 | 6/1995 | Hsieh et al. | 395/775 |
| 5,465,056 | 11/1995 | Hsieh et al. | 326/41 |
| 5,530,434 | 6/1996 | Kanda | 340/825.04 |

*Primary Examiner*—Michael Horabik
*Assistant Examiner*—Yonel Beaulieu
*Attorney, Agent, or Firm*—Smith-Hill and Bedell

[57] ABSTRACT

A crosspoint switch routes signals between its terminals in routing patterns defined by routing data from a host controller. The crosspoint switch includes an array of pass transistors. Each pass transistor, when turned on, provides a signal path interconnecting a separate, unique pair of the switch terminals. The crosspoint switch also includes two static random access memory banks. Each memory bank stores routing data defining a separate routing pattern and produces a separate set of output signals reflecting its stored data. A multiplexer delivers the output signals of a selected one of the memory banks to the switch array for controlling its pass transistors so that the switch array implements the routing pattern defined by the data in the selected memory bank. By loading routing data defining different routing patterns into the two memory banks, a host controller can thereafter quickly make the crosspoint switch alternate between the two routing patterns by toggling the multiplexer's control input.

7 Claims, 3 Drawing Sheets

CROSSPOINT SWITCH WITH BANK-SWITCHED MEMORY

This is a continuation of application Ser. No. 08/516,318 filed Aug. 17, 1995, now abandoned, which is a continuation-in-part of application Ser. No. 08/333,524 filed Nov. 2, 1994, now U.S. Pat. No. 5,465,056.

BACKGROUND OF THE INVENTION

1. Field of the Invention

The present invention relates in general to crosspoint switches and in particular to a crosspoint switch having a bank-switched memory.

2. Description of Related Art

Many electronic systems employ field programmable gate arrays (FPGAs), such as those manufactured by Xilinx Inc., to selectively reconfigure system component interconnections for various modes of system operation. A typical FPGA includes several input and output ports and a network of logic gates interconnecting the input and output ports. The FPGA also includes a number of memory cells that store data received from an external source such as a computer. The data in the memory cells control switching states of various gates in the FPGA. By loading data into the memory cells, the computer configures (i.e. "programs") the FPGA for generating an output signal at any given port that is a selected logical combination of states of input signals at one or more of the input ports. An FPGA may be used for selectively routing signals between system components and may also be used to perform various logic operations on the signals being routed. While programmable FPGAs are useful, they have limitations. All input/output signals must be unidirectional and all signals must be of the same logic circuit type, such as TTL or CMOS. Thus, the FPGAs cannot directly interconnect bidirectional signal sources and cannot interface differing types of devices such as TTL and CMOS devices.

On the other hand a field programmable interconnect device (FPID) employing a crosspoint switch routes unidirectional as well as bidirectional signals between electronic components. Such an FPID is taught in U.S. Pat. No. 5,282,271 titled I/O BUFFERING SYSTEM TO A PROGRAMMABLE SWITCHING APPARATUS issued Jan. 25, 1994 to Wen-Jai Hsieh et al. The described FPID includes a crosspoint switch employing a 64×64 triangular array of pass transistors to route signals between a set of 64 terminals. Each pass transistor interconnects a separate pair of the terminals when turned on and routes a signal in either direction between the terminal pair. The crosspoint switch also includes a 64×64 bit static random access memory (SRAM) for storing routing control data. Each bit of each 64-bit word stored in the memory controls the switching state of a separate one of the pass transistors. By changing the state of a bit stored in the SRAM, a host controller can make or break a connection between a corresponding pair of I/O ports.

The host controller transmits 64-bit routing data words and 6-bit memory addresses to the crosspoint switch via a serial bus. The crosspoint switch includes a memory controller for writing each incoming routing data word to the SRAM at the indicated address. To completely change the routing pattern provided by the crosspoint switch, the host controller must transmit 64 sets of 64-bit routing data words and 6-bit addresses to the crosspoint switch. Since so many serial bus clock cycles are required to reprogram a crosspoint switch array, crosspoint switches are not used in applications requiring high speed, concurrent switching of large numbers of signals. For example, the prior art FPID could be used for switching the parallel I/O bus of a computer processor between buses of selected peripheral devices. But the time required to transmit data to the FPID for reprogramming the crosspoint switch makes the FPID too slow for many bus switching applications. The prior art FPID is also relatively slow in making or breaking a single connection between two specific crosspoint switch terminals because the host computer must send to the memory controller not only the single bit in the SRAM controlling the connection, but 63 other data bits and an 6-bit address as well. Thus making or breaking even a single connection between two FPID I/O ports requires a minimum of 70 clock cycles on the serial JTAG bus.

What is needed is an improved crosspoint switch that can quickly switch between alternative routing patterns with minimal reprogramming delay.

SUMMARY OF THE INVENTION

A crosspoint switch in accordance with the present invention routes signals between its terminals in routing patterns defined by routing data from a host controller. The crosspoint switch includes an array of pass transistors and each pass transistor, when turned on, provides a signal path interconnecting a separate, unique pair of the switch terminals. The crosspoint switch also includes two static random access memory banks. Each memory bank stores routing data defining a separate signal routing pattern for the crosspoint switch and produces a separate set of output signals reflecting its stored data. A multiplexer delivers the output signals of a selected one of the memory banks to the switch array for controlling its pass transistors so that the switch array implements the routing pattern defined by the data in the selected memory bank. By loading routing data defining different routing patterns into the two memory banks, a host controller can thereafter quickly make the crosspoint switch alternate between the two routing patterns by toggling the multiplexer's control input.

It is accordingly an object of the invention to provide an improved crosspoint switch that can quickly switch between alternative routing patterns with minimal reprogramming delay.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
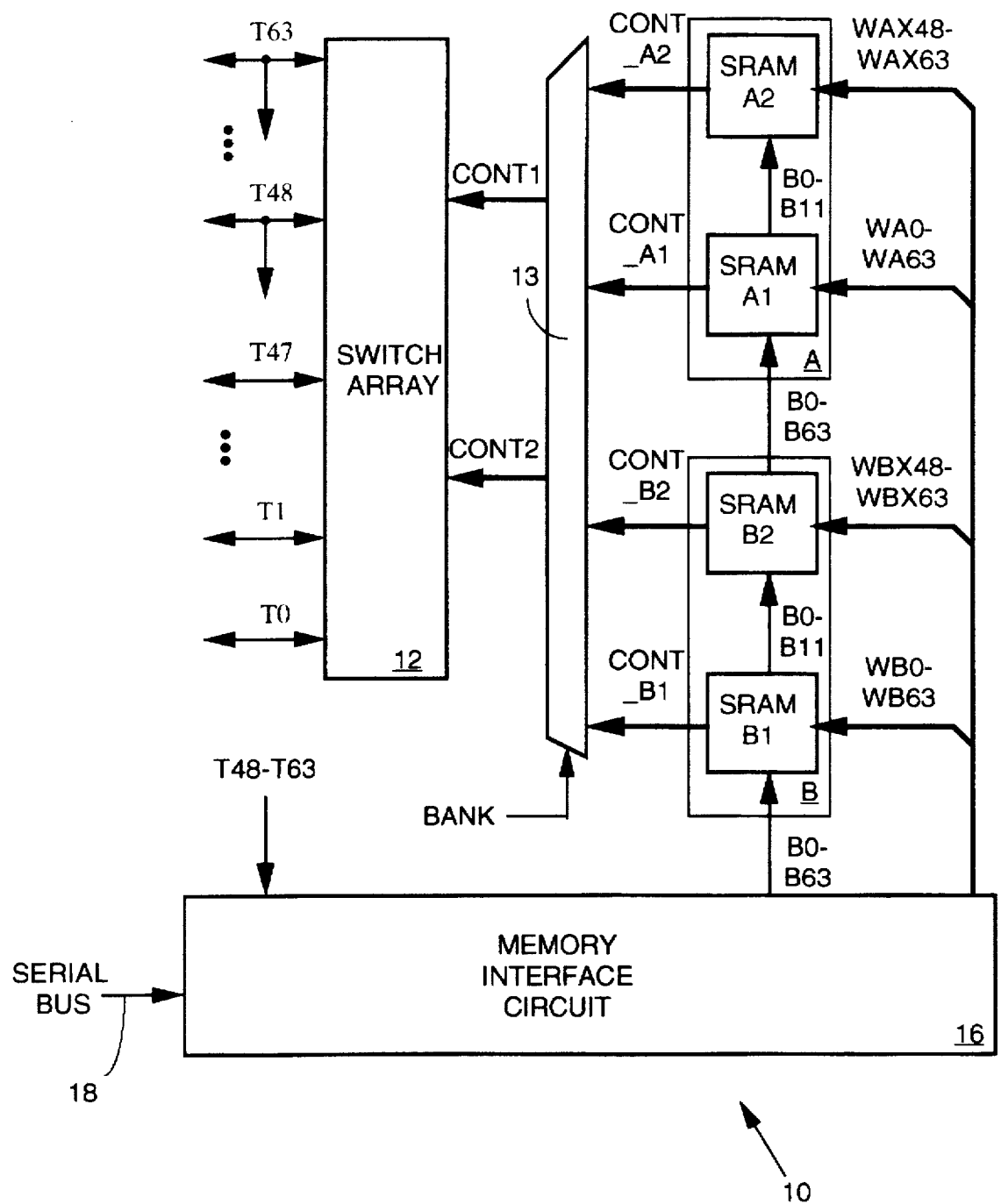
FIG. 1 is a block diagram illustrating a crosspoint switch in accordance with the present invention.

FIG. 1 is a block diagram of a crosspoint switch 10 in accordance with the present invention. In the preferred embodiment of the invention, switch 10 employs a 64×64 triangular pass transistor switch array 12 for selectively routing unidirectional or bidirectional signals between its input/output (I/O) terminals T0–T63. (In alternative embodiments of the invention, switch 10 may employ a switch array 12 having larger or smaller numbers of terminals.) The signal routing pattern provided by array 12 is controlled by routing data stored in one of two memory banks, bank A and bank B. An external host controller (not shown) such as a computer or other data source controls the routing patterns by transmitting routing data to a memory interface circuit 16. Interface circuit 16 writes the routing data into memory banks A or B. A multiplexer 13, switched by an externally generated control signal (BANK), selects whether data in memory bank A or memory bank B controls the signal routing pattern of switch array 12.

When data in banks A and B define two different signal routing patterns, any external control signal source can make switch 10 rapidly switch from one routing pattern to the other by changing the state of the BANK control signal input to multiplexer 13. Crosspoint switch 10 is suitable for use in high speed switching applications where a large number of connections must be quickly altered, as for example in switching a large parallel computer bus back and forth between buses of two peripheral devices. While in the preferred embodiment of the invention crosspoint switch 10 employs only two memory banks A and B storing two alternative routing patterns, alternative embodiments of the invention may employ a larger number of memory banks so as to permit rapid switching among a larger number of routing patterns.

Switch 10 may be set to operate in either "normal" or "rapid connect" modes. When switch 10 is set to operate in its "normal" mode, an external host controller establishes a signal routing pattern in either memory bank A or B by transmitting routing data to memory interface circuit 16 via a serial bus 18 in the form of a sequence of 64-bit words, each accompanied by memory addressing information. Interface circuit 16 stores the incoming data words at the indicated addresses in memory bank A or B.

When switch 10 is set to operate in the alternative "rapid connect" mode, terminals T48–T63, rather than serving as input/output terminals for switch array 12, instead serve as a 16-bit parallel input to memory interface circuit 16. Using the rapid connect mode, a host controller communicating through a parallel bus connected to terminals T48–T63 may quickly alter a portion of a routing pattern previously stored in either memory bank A or B by sending a single parallel data word to memory interface circuit 16. The parallel data word is encoded to indicate the desired pattern change. As will be discussed in detail herein below, interface circuit 16 employs a decoding system that allows it to quickly and flexibly alter variably sized portions of the routing pattern defined by data in either memory bank A or B in response to only a single parallel data word from the host controller. The host controller can command such a change to a routing pattern quickly because it can send that parallel data word to interface circuit 16 in only one cycle of its parallel bus connected to terminals T48–T63. The combination of ability to switch memory banks and the ability to quickly and flexibly alter portions of the stored routing pattern data makes crosspoint switch 10 suitable for use in applications where it must rapidly and flexibly route large numbers of signals in a variety of alternative patterns with little or no reprogramming delay when switching between patterns.

Figure 2:
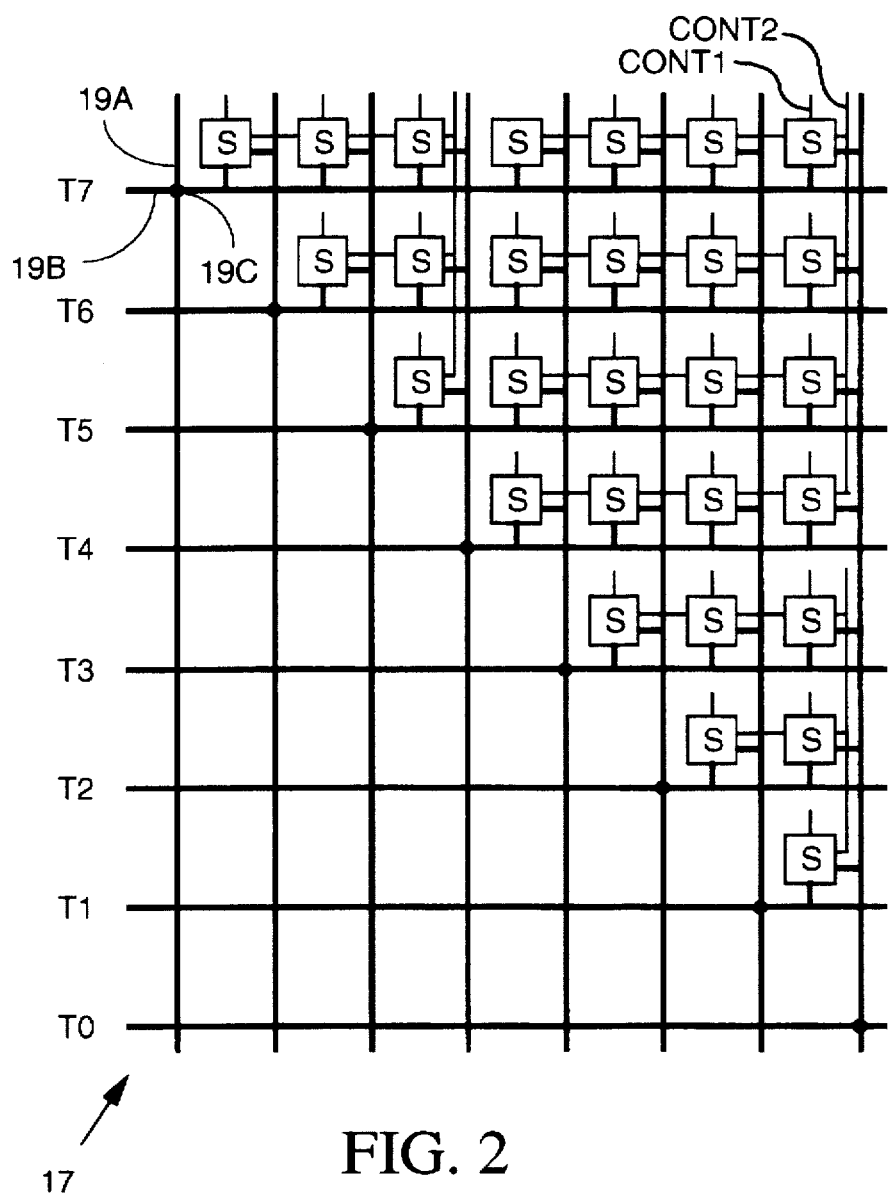
FIG. 2 is a block diagram of a portion of the switch array of FIG. 1.

FIG. 2 shows an 8×8 triangular portion 17 of switch array 12 of FIG. 1. Array portion 17 includes a set of 8 vertical conductors 19A, a set of 8 horizontal conductors 19B and a triangular array of switch cells S. Each terminal T0–T7 is connected to a separate vertical line 19A. Each vertical line 19A is connected to a corresponding horizontal line 19B at an intersection 19C so that each terminal T0–T7 forms a node that extends both horizontally and vertically through the array. One switch cell S is provided for selectively interconnecting each a unique pair (TX,TY) of terminals T0–T7 where X and Y are integers from 0 through 7, and X does not equal Y. The full 64×64 switch array 12 of FIG. 1 has a generally similar layout to the 8×8 portion 17 shown in FIG. 2 but has 64 vertical and 64 horizontal conductors with a triangular array of switch cells having from 1 to 63 cells S in each row and column.

Figure 3:
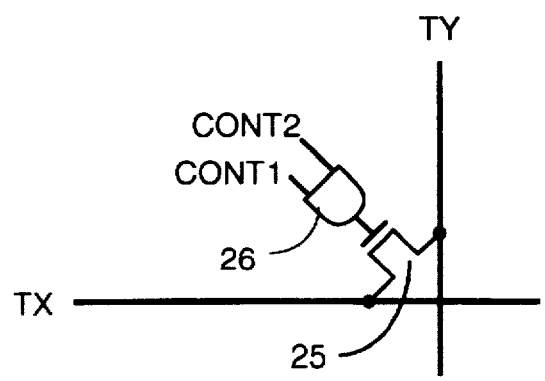
FIG. 3 is a block diagram of a typical switch cell of the array of FIG. 2.

FIG. 3 illustrates a typical switch cell S of FIG. 2, including a pass transistor 25 connected between terminals TX and TY and an AND gate 26 receiving a pair of signals (CONT1 and CONT2) at its inputs. The output of AND gate 26 controls the gate of transistor 25. Referring to FIGS. 2 and 3, each switch cell S conveys signals bidirectionally between the corresponding terminal pair (TX,TY). When CONT1 and CONT2 are both asserted, the switch S interconnects the corresponding terminal pair (TX,TY) and conveys signals bidirectionally there between. A separate CONT1 signal is supplied to each switch cell S of the array. A separate CONT2 signal is provided to each 4×4 subarray of switch cells S. (Note that due to the triangular layout of array 12 "4×4 subarrays" along the main diagonal of the array are not fully populated with all 16 switch cells S.) When a CONT2 signal is deasserted, no switch cell S of the 4×4 subarray that receives the CONT2 signal interconnects its terminals. When a CONT2 signal input to a 4×4 subarray is held high, the separate CONT1 signal input to each cell S of the 4×4 subarray determines whether that cell S provides a signal path between its corresponding pair of terminals (TX,TY).

Referring again to FIG. 1, memory bank A consists of two static random access memories (SRAMs) A1 and A2 and memory bank B consists of two SRAMs B1 and B2. SRAMs A1 and A2 are arrays of addressable memory cells, each memory cell storing a single bit. Each memory cell in SRAM A1 produces as output a separate one of a set of control signals CONT_A1. Each CONT_A1 signal indicates the state of the bit stored in the memory cell and corresponds to a separate one of the CONT1 signals supplied to each switch cell within array 12. Each memory cell of SRAM A2 corresponds to a separate one of the 4×4 switch cell subarrays of switch array 12 and produces a separate one of a set of control signals CONT_A2 indicating the state of its stored bit. Each CONT_A2 signal corresponds to a separate CONT2 control signal. SRAMs B1 and B2 of memory bank B are identical to SRAMs A1 and A2 of bank A and produce sets of control signals CONT_B1 and CONT_B2 similar to CONT_A1 and CONT_A2, respectively, in response to their stored data. Depending on the state of its BANK signal input, multiplexer 13 supplies the output signals of either memory bank A (CONT_A1/CONT_A2) or memory bank B (CONT_A1/CONT_A2) as the CONT1 and CONT2 input signals to switch array 12.

The data stored in either memory bank A or B alone completely defines the signal routing pattern of switch array 12. Thus when two different routing patterns have been defined by data stored in memory banks A and B, an external controller can toggle the state of the BANK signal controlling multiplexer 13 to quickly switch between the two routing patterns. The ability to quickly switch between routing patterns defined by the two memory banks not only speeds routing pattern changes, it can also eliminate problems associated with routing pattern transition states when altering a pattern defined in prior art crosspoint switches having only a single memory bank. In such prior art switch, a host controller changes a routing pattern by writing over data in that memory bank. However the routing pattern defined by the data in the memory bank does not change instantly from the first to second pattern because the process of writing data into memory takes time. As data is written into the memory, the routing pattern it defines goes through transition states and the routing pattern provided by switch array 12 passes through these transition states. These transition states may have undesirable or unexpected results from the point of view of a system connected to terminals T0–T63. However since crosspoint switch 10 has two switched memory banks A and B, crosspoint switch 10 allows a host controller to change the pattern defined by, for example, memory bank A while memory bank B actively controls switch array 12 and then to switch multiplexer 13 so that memory bank A now controls the routing pattern. Since the switch operation is very fast the routing pattern change is essentially "instantaneous" from the point of view of a system connected to terminal T0–T63 and the routing pattern does not pass through transition states.

Crosspoint Switch Programming and Operation

When selected by multiplexer 13, SRAMs A1/A2 of memory bank A provide a form of hierarchical control over switch array 12. SRAM A1 provides the lowest level of control and SRAM A2 provides higher levels of control. Each set of sixteen bits in SRAM A1 controls the 16 CONT1 signal inputs to a corresponding 4×4 subarray of switch cells of array 12. Those 16 bits in SRAM A1 define, at the lowest level of control, the basic routing pattern provided by that 4×4 subarray of switch cells. But a single bit in SRAM A2 controlling the CONT2 supplied in common to each of the 16 cells of that 4×4 subarray, when set to "0" can inhibit that subarray from implementing that basic routing pattern, or when set to "1" can enable the routing pattern. Thus at the lowest level of control, data in SRAM A1 defines routing patterns provided by each separate 4×4 subarray of array 12 and at higher levels of control, data bits in SRAM A2 select which of those routing patterns are enabled and which are inhibited. SRAMs B1/B2 of memory bank B provides the same type of hierarchical control over switch array 12 when bank B is selected by multiplexer 13.

When operating crosspoint switch 10 at the lowest level of control, the host controller initializes the crosspoint switch by writing a logical "1" bit into every memory cell of SRAMs A2 and B2 so that when multiplexer 13 selects memory bank A or B, all of the CONT2 signals are initially asserted and none of the 4×4 subarrays of array 12 are inhibited from implementing a connection pattern when any of their CONT1 signals are asserted. The host controller then writes routing data into every cell of SRAM A1 or B1 (or both) to completely define one or two alternative connection patterns between pairs of terminals T0–T63. The host controller sets the state of a bit stored in each particular memory cell of SRAM A1 or B1 to a logical "1" to indicate a connection is to be made between a corresponding terminal pair and sets the bit in the cell to a logical "0" to indicate no connection is to be made between the terminal pair. After the connection patterns have been defined, the host controller can thereafter change them by writing new data into selected areas of SRAMs A1 or B1.

To operate at a higher level of control, the host controller first initializes the crosspoint switch by writing data into all of the cells of SRAMs A1 or B1 such that various 4×4 subarray portions of switch cells of array 12, when enabled by their CONT2 signals, connect array terminals T0–T63 in alternative connection patterns. It also writes data into SRAMs A2 or B2, placing a logical "1" in the memory cells driving the CONT2 signals to enable particular 4×4 subarrays. Thereafter when the host controller wants to select an alternative connection pattern, it writes new data into to selected memory cells within SRAM A2 or B2. By changing the data in SRAM A2 or B2 selected by multiplexer 13, the host controller reselects the particular 4×4 switch cell subarrays within array 12 that are enabled, thereby altering the connection states between a large number of terminals T0–T63 by writing only a relatively smaller number of bits into a memory bank.

The higher level of control provided by SRAMs A2 and B2 allow for fast switching between, for example, three parallel buses A, B and C connected to T0–T47. Each bus may have for example 16 lines. A host controller initially loads data into, for example, SRAM A1 so that one 16×16 block of cells in array 12, when enabled by CONT2 signals, connects bus A to bus B and so that a second 16×16 block of cells in array 12, when enabled by other CONT2 signals, connects bus A to bus B. Thereafter, the host controller writes appropriate data to SRAM A2, rather than SRAM A1, whenever bus A is to be switched between bus B and bus C. The host controller could write data to SRAM A1 to switch bus A from bus B to bus C. But since each bit in SRAM A2 controls many more cells in array 12 than a bit in SRAM A1, the host controller writes less data to SRAM A2 to change a routing pattern. Since transferring data from a host controller to crosspoint switch 10 requires time, the higher control level provided by SRAM A2 reduces the time the host controller needs to alter a routing pattern by reducing the time required to transmit routing control data.

As illustrated in FIG. 1, rows of memory cells of SRAM A1 are addressed by 64 "word" lines WA0–WA63 and each column of cells receives data via one of 64 "bit" lines B0–B63. Since SRAM A1 is a static random access memory, each bit "line" actually requires two conductors and conveys a differential signal indicating a state (high, low or tri-state) of a bit to be stored in the array. Those skilled in the art will appreciate that other types of memory cells well known in the art may be employed. When one of word lines WA0–WA63 is asserted, each memory cell along one row of memory cells within SRAM A1 receives and stores a bit appearing on a corresponding bit line B0–B63. If a bit line is in a tri-state condition, the data bit content of the addressed memory cell remains unchanged. Thus to write data to a memory cell row within SRAM A1, a 64-bit data word is placed on bit lines B0–B63. A selected one of the WA0–WA63 word lines is then strobed to write the 64-bits of the word into adjacent cells of the selected row of SRAM A1.

The 12×12 SRAM A2 is write accessed in a similar fashion. The B0–B11 lines also convey bits to the 12 columns of memory cells of SRAM A2, and each of the twelve rows of memory cells of SRAM A2 is write enabled by strobing a separate word line WAX48–WAX63.

Memory bank B is identical to memory bank A in construction and function. SRAMs B1 and B2 receive the same bit lines B0–B63 and B0–B11 as SRAMs A1 and A2. But SRAM B1 is write addressed by word lines WB0–WB63 and SRAM B2 is write addressed by word lines WBX47–WBX63. As will be discussed below, the host controller selects the particular SRAM A1, A2, B1 or B2 to receive programming data sent either by the serial bus 18 or via a parallel bus connected to terminals T48–T63 by first sending an instruction to memory interface circuit 16 via the serial bus 18. The host controller may write data into an SRAM of either the "active" memory bank currently selected by multiplexer 13 or into an SRAM of the "inactive" bank not currently selected by multiplexer 13.

Normal Mode Operation

As mentioned above, crosspoint switch 10 permits a host controller to use either of two modes for write accessing the SRAMs of bank A or bank B the "normal" mode and the "rapid connect" mode. In the normal mode, the host controller sends information to memory interface circuit 16 via serial bus 18 of FIG. 1. In the rapid connect mode, the host controller sends information to interface circuit via a parallel bus that may be connected to terminals T48–T63 of crosspoint switch 10. When terminals T48–T63 are used for sending information to interface circuit 16, they are not available as input/output terminals for signals to be routed by switch array 12.

Referring again to FIG. 1, in the normal mode of operation the host controller sends information to memory interface circuit 16 in serial fashion via serial bus 18. The information may include an instruction, mode control data, and signal routing control information. The instruction tells the memory interface circuit 16 whether the host controller is about to send mode control or signal routing information. Mode control data indicates whether the system is to operate in normal or rapid connect mode and which SRAM is to receive the incoming routing data. Signal routing information includes a 64-bit data word to be stored in one of SRAMS A1, A2, B1 or B2 and an encoded 6-bit address indicating which word line (or lines) of one of these SRAMs will receive a write pulse.

Figure 4:
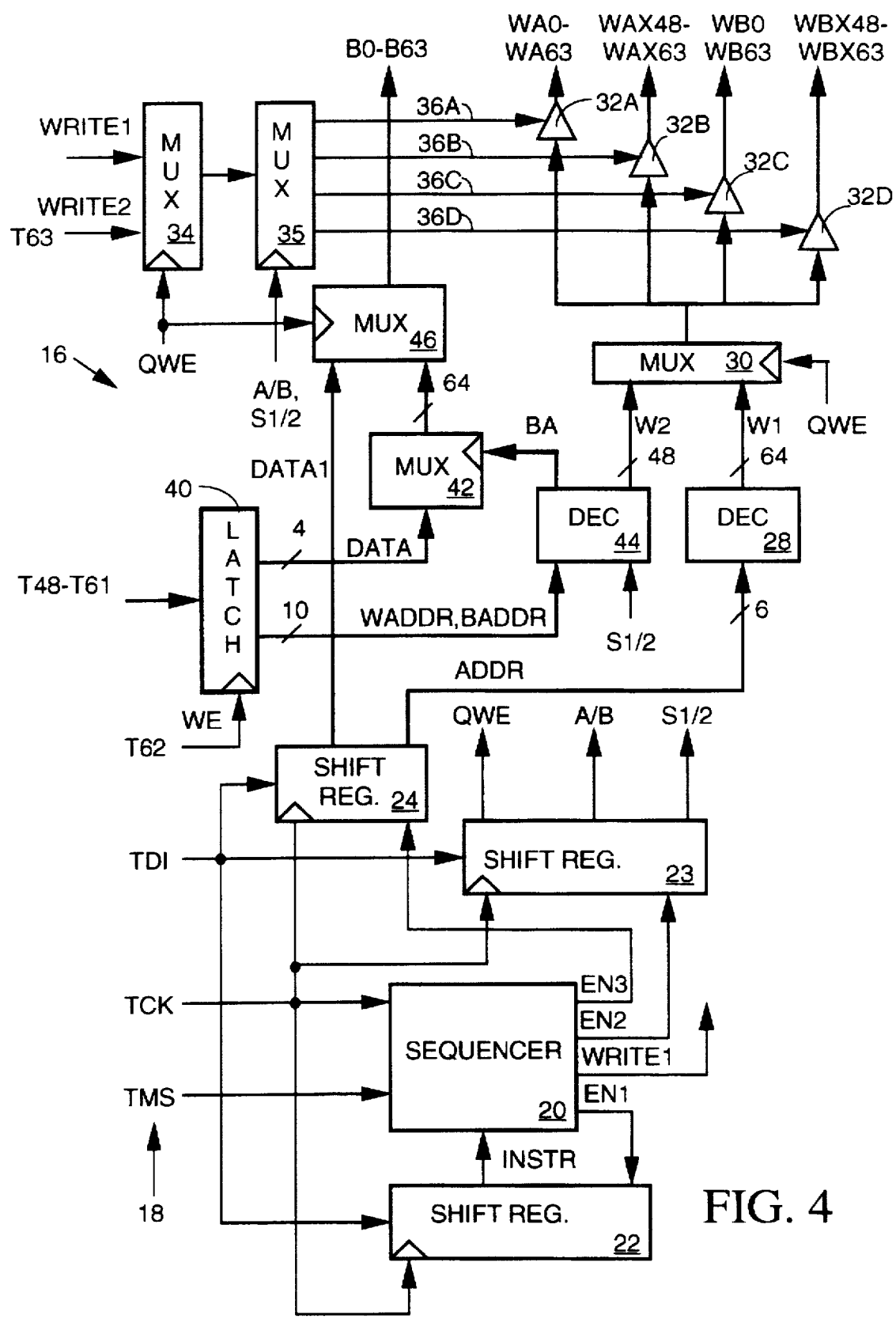
FIG. 4 is a block diagram illustrating details of the memory interface circuit of FIG. 1.

FIG. 4 illustrates memory interface circuit 16 of FIG. 1 in more detailed block diagram form. The serial bus 18 includes three lines TDI, TCK and TMS. To select the SRAM to receive data and to indicate whether the selected SRAM is to be write accessed in the normal or rapid connect mode, the host controller transmits a pulse on the TMS line to tell interface circuit 16 to prepare to receive an instruction. A sequencer 20 responds to the TMS pulse by input enabling a 1-bit shift register 22 via a control signal EN1. On the next TCK pulse, shift register 22 receives a single bit instruction (INSTR) from the host computer via the TDI line. The INSTR bit, shifted into register 22, is thereupon delivered to sequencer 20 which turns off the EN1 signal on the next TCK pulse. The host controller sets the INSTR bit to a logical "0" to indicate that it is about to transmit three data bits to a 3-bit shift register 23. A first bit (QWE) is set to a logical "0" when the SRAMs of FIG. 1 are to be programmed in the "normal" mode or to a "1" when the SRAMs are to be programmed using the "rapid connect" mode. A second bit (A/B) selects whether memory bank A or B is to receive incoming routing data, and the third bit (S1/2) indicates which of two SRAMs (A1,A2) or (B1,B2) of the selected bank A or B is to receive the routing data. Thus for example, if the host controller wishes to write data to SRAM B1, it sets bit A/B to a "1" to indicate bank B rather than bank A and sets bit S1/2 to a "0" to indicate SRAM B1 rather than SRAM B2.

When sequencer 20 detects that INSTR is a logical "0", it asserts a signal EN2 input enabling a 3-bit shift register 23 for three cycles of the TCK clock signal, thereby allowing the host controller to shift the three QWE, A/B and S1/2 bits into a register 23 via the TDI line. Shift register 23 retransmits these bits elsewhere for use in controlling operating modes as detailed below.

The host controller sends an INSTR bit that is a logical "1" to shift register 22 to indicate that interface circuit 16 should prepare to receive data for storage in the SRAM last selected to receive it. In response to a "1" INSTR bit, sequencer 20 asserts an EN3 signal input enabling a shift register 24 for 70 cycles of the TCK clock, thereby allowing the host controller to shift 70 data bits into shift register 24 via the TDI line. Of the 70 bits stored in shift register 24, 64 bits (DATA1) are transmitted via a multiplexer 46 to the bit lines B0–B63 delivering data input to SRAMS A1, A2, B1 and B2 of FIG. 1. The remaining 6 bits (ADDR) stored in shift register 24 indicate an address of a word to be stored in the selected SRAM. A decoder 28 decodes the ADDR bits and asserts one of its 64 output lines W1. When the memory interface 16 is operating in the normal mode a multiplexer 30, controlled by the QWE bit of register 23, connects the W1 lines to inputs of four sets of tristate buffers 32A–32D. Tristate buffers 32A, when enabled by a pulse on line 36A, temporarily connect the all 64 W1 lines to the 64 word address lines WA0–WA63 leading to SRAM A1 of FIG. 1. Tristate buffers 32B, when enabled by a pulse on line 36B, temporarily connect the first 12 lines of the W1 lines to the 12 word address lines WAX48–WAX63 leading to SRAM A2. Similarly tristate buffers 32C and 32D, when enabled by pulses on lines 36C and 36D, respectively connect W1 to word address lines WA0–WA63 leading to SRAM B1 or lines WBX48–WBX63 leading to SRAM B2.

On receipt of the 71st TCK pulse, sequencer 20 pulses a WRITE1 output signal. In the normal mode, a multiplexer 34 controlled by the QWE within register 23, and a multiplexer 35 controlled by the A/B and S1/2 bits of register 23 pass the WRITE1 signal pulse onto an appropriate one of control lines 36A–36D, thereby to output enable one set of tristate buffers 32A, 32B, 32C or 32D. Since the decoder 28 is asserting one of the word address lines via multiplexer 30 and one of buffers 32A–32D, the 64 bits of data B0–B63 are written into a selected row of the selected SRAM A1, A2, B1 or B2. To fully program all four SRAMs, the host controller must repeat the memory write operation for each row of each SRAM, and must alter the A/B and S1/2 bits in shift register 23 whenever changing the SRAM to receive data.

Rapid Connect Mode

To alter, inhibit or enable an established routing pattern, a host controller may need to change the bit stored in only one cell or a few memory cells of one of the SRAMs. However, in the normal mode the host controller loads data into SRAMs on a row-by-row basis, and must transmit an entire 64 bit data word when doing so. It also must send a 6-bit address as well as a TMS pulse and an INSTR bit. This serial transmission requires a substantial number of clock cycles of serial bus 18. While the normal mode of operation is relatively fast and efficient at loading large amounts of data into the SRAMs so as to completely define a new routing pattern, it is relatively slow and inefficient at altering data into only a few selected cells of the SRAMs.

In the alternative rapid connect mode of operation, the host controller may transmit routing data in the form of parallel instructions to memory interface circuit 16 via a 16-bit parallel bus which can be connected to interface circuit 16 through switch array terminals T48–T63. Since the rapid connect mode makes use of terminals T48–T63 for conveying programming information memory interface circuit 16, these terminals may not be used as switch array 12 input for signal routing purposes when the crosspoint switch is to operate in the rapid connect mode. (In alternative embodiments memory interface circuit may have dedicated input terminals for the parallel instruction.)

Before entering the rapid connect mode, all data within memory banks A and B is set to desired initial states using the normal mode of write accessing their SRAMs. In particular, data in all memory cells of SRAMs A1 and B1 along word lines WA48–WA63 and WB48–WB63 and all memory cells of SRAMs A1 and B1 along bit lines B48–B63 should be set to logical "0" to inhibit operation of corresponding switch cells in array 12 that switch terminals T48–T63. Table I lists the function of each bit or signal appearing terminal T48–T63.

TABLE I

| TERMINAL | NAME | FUNCTION |
|---|---|---|
| T63 | WRITE 1 | Write Strobe |
| T62 | WE | Write Enable |
| T58–T61 | DATA | Data |
| T54–T57 | BADDR | Bit Address |
| T48–T53 | WADDR | Word Address |

The word address WADDR (T48–T53) is a 6-bit data value indicating a particular one or subset of adjacent lines of word lines WA0–WA63, WAX48–WAX63, WB0–WB63 or WBX48–WBX63 of the bank currently selected to receive incoming data. The bit address BADDR (T54–T57) is a 4-bit value selecting a particular subset of four bit lines of the 12 or 48 bit lines (B0–B11 or B0–B47) leading to SRAM A1, A2, B1 or B2 currently selected to receive data. The terminals (T54–T57) receive the data (DATA) that is to be placed on the selected four bit lines. The write enable signal WE (T62) is pulsed low to indicate that the data and addresses are available on terminals T48–T61. The WRITE strobe signal WRITE1 (T63) is asserted to initiate a memory write operation wherein the four data bits (T54–T57) placed on the indicated four bit lines are actually written into the selected SRAM at the indicated address.

When the crosspoint switch is in the normal mode of operation, a QWE bit of logic state "0" is stored in register 23. To switch crosspoint switch 10 to rapid connect mode, the host controller sets the QWE bit in register 23 to a logical "1". Thereafter, to write data to an SRAM currently selected by the A/B and S1/2 bits in register 23, the host controller transmits the data and addressing information DATA, BADDR and WADDR to a latch 40 via terminals T48–T61 and then pulses the WE signal at terminal T62. In response to the WE signal pulse, latch 40 latches its 4-bit DATA input onto an input of a multiplexer 42 and latches its 4-bit BADDR and 6-bit WADDR inputs onto inputs of a decoder 44.

Rapid Connect Writing to SRAM A1 or B1

Decoder 44, which also receives the S1/2 bit output of shift register 23, decodes the BADDR and WADDR addresses. If the S1/2 bit is a "0" indicating that SRAM A1 or B1 is being write accessed, decoder 44 decodes the WADDR address to assert one of its 48 output lines W2. (WADDR addresses greater than 47 are invalid when writing in the rapid connect mode to SRAM A1 or B1.) It also decodes the BADDR address to select one of 12 sets of four adjacent bit lines of B0–B47 to receive the four DATA bits. (The rapid connect mode is not used to write data to SRAM A1 or B1 along bit lines B48–B63.) When QWE is set for rapid connect mode, multiplexer 30 ties the W2 lines to inputs of buffers 32A–32D and multiplexer 42 places the four DATA bits on four selected lines of its 64 line output DATA2 and tristates the other 60 lines. Immediately after the host controller loads the data and address into latch 40 it asserts the WRITE2 signal at terminal T63. Multiplexer 35 passes that signal onto the appropriate one of buffer enable line 36A or 36C to enable one of buffer sets 32A or 32C. The four bits of data on four lines of B0–B47 are then written into the selected SRAM A1 or B1 at the appropriate word locations.

Rapid Connect Writing to SRAM A2 or B2

When bit S1/2 is a "1", indicating SRAM A2 or B2 is being write accessed, decoder 44 decodes the WADDR and BADDR addresses using a different decoding scheme whereby it asserts from one to four of the first 12 of its output lines W2. Upon detecting the S1/2 it is set to a "1", decoder 44 decodes the combination of BIT_ADDR and WORD_ADDR in the manner indicated below in TABLE II. (The decoding scheme assumes SRAM A2 is being accessed. The scheme is similar when SRAM B2 is being accessed.)

TABLE II

| DECODE MODE | BADDR | WADDR | BIT LINE | WORD LINE |
|---|---|---|---|---|
| NIBBLE | 0 | 1 | B0–B3 | WAX(1) |
| NIBBLE | 16 | 1 | B4–B7 | WAX(1) |
| NIBBLE | 32 | 1 | B8–B11 | WAX(1) |
| BYTE | 4 | m | B0–B3 | WAX(m), WAX(m + 1) |
| BYTE | 20 | m | B4–B7 | WAX(m), WAX(m + 1) |
| BYTE | 36 | m | B8–B11 | WAX(m), WAX(m + 1) |
| WORD | 12 | n | B0–B3 | WAX(n)...WAX(n + 3) |
| WORD | 28 | n | B4–B7 | WAX(n)...WAX(n + 3) |
| WORD | 44 | n | B8–B11 | WAX(n)...WAX(n + 3) |

The first three rows of TABLE II indicate the "nibble" mode of decoding the word and bit addresses. In the nibble mode, the four bits of DATA are written to four adjacent memory cells in SRAM A2 that lie along a single word line. In Table II the variable "l" may have any value in the set {48, . . . ,63}. For example, when BIT_ADDR is 0 and WORD_ADDR is 48, decoder 28 places the four bit DATA on bit lines B0–B3 and asserts word line WAX48, thereby writing the four bits of data into four adjacent cells of SRAM A2 along word line WAX48. Or for example, when BIT_ADDR is 32 and WORD_ADDR is 57, decoder 28 places the four bit DATA on bit lines B8–B11 and asserts word line WAX57 to write DATA into four cells along word line WAX48. Since the bit in each memory cell of SRAM A2 inhibits or enables a 4×4 block of cells within switch cell array 12, then by writing bits to four cells in SRAM A2, the host controller can inhibit or enable four 4×4 blocks of switch cells within array 12.

The second three rows of TABLE II indicate the "byte" mode of address decoding. In the byte mode, the four bits of DATA are written to four adjacent memory cells in SRAM A2 lying along each of two adjacent word lines. In Table II the variable "m" may have any value in the set {48, 50, 52, 54, 56, 58, 60, 62}. For example, when BIT_ADDR is 4 and WORD_ADDR is 48, decoder 28 places the four bit DATA on bit lines B0–B3 and asserts word lines WAX48 and WAX49, thereby writing the four bits of data into four adjacent cells of SRAM A2 along each word line WAX48 and WAX49. Or for example, when BIT_ADDR is 20 and WORD_ADDR is 50, decoder 28 places the four bit DATA on bit lines B4–B7 and asserts word lines WAX50 and WAX51 to write DATA into four cells along each word line WAX50 and WAX51. Since the bit in each memory cell of SRAM A2 inhibits or enables a 4×4 block of cells within switch cell array 12, then by writing bits to the eight cells in SRAM A2, we inhibit or enable four 4×8 blocks of switch cells.

The third three rows of TABLE II illustrate the "word" mode of writing data to SRAM A2. In the word mode, the four bits of DATA are written to four adjacent memory cells in SRAM A2 that lie along each of four adjacent word lines. In Table II the variable "n" may have any value in the set {48,52,56,60}. For example, when BIT_ADDR is 12 and WORD_ADDR is 48, decoder 28 places the four bit DATA on bit lines B0–B3 and asserts word lines WAX48, WAX49, WAX50 and WAX51, thereby writing the four bits of data into four adjacent cells of SRAM A2 along word lines WAX48–WAX51, a total of sixteen cells. Since the bit in each memory cell of SRAM A2 inhibits or enables a 4×4 block of cells within switch cell array 12, then by writing bits to sixteen cells in SRAM A2, the host controller inhibits or enables a four 8×8 blocks of switch cells.

The rapid connect mode of writing data to SRAM A2 or B2 is particularly useful when switching parallel buses connected to the crosspoint switch terminals. For example suppose we want to switch an 8-bit bus A between two 8-bit buses B and C. The host controller initially loads data into SRAM A1 such that a first 8×8 block of switch cells interconnects bus A to bus B when enabled by their CONT2 signals and such that a second 8×8 block of cells interconnects bus A to bus C when enabled by their CONT2 signals. The host controller also initially loads data into all of the SRAM2 cells to turn off all the CONT2 signals such that no terminals are interconnected. Thereafter using the rapid connect byte mode of addressing, the host controller can with one command to the memory controller 16 turn on all of the CONT2 signals to the first 8×8 block, thereby connecting bus A to bus B. Later, with a single rapid connect mode command to memory controller 16, the host controller can turn off all the CONT2 signals to the first 8×8 block. In a second rapid connect mode command the host controller can turn on all the CONT2 signals to the second 8×8 block. This causes the crosspoint switch to disconnect bus A from bus B and to connect bus A to bus C. Since the operation requires only two cycles of a parallel bus connected to terminals T48–T63, the crosspoint switch can rapidly switch the buses.

The alternative nibble, byte and word modes of SRAM A2/B2 addressing provided by decoder 44 makes the size of the switch cell subarrays affected by a rapid connect write operation a variable function of the address conveyed in the rapid connect command from the host controller. This provides flexibility in switching varying sizes of parallel buses. The nibble mode is most useful for 1 cycle make or break switching of 4 bit parallel buses. The byte mode is most useful for one cycle make or break switching of 8 bit buses. The word mode is useful for one cycle make or break switching of 16 bit buses.

The normal and rapid connect modes of crosspoint switch 10 operation, in combination with hierarchical memory address decoding and memory bank switching allows the host controller to rapidly and efficiently load and modify alternative routing patterns into crosspoint switch 10 and to quickly tell crosspoint switch 10 to switch between either of those patterns. While the forgoing specification has described preferred embodiment(s) of the present invention, one skilled in the art may make many modifications to the preferred embodiment without departing form the invention in its broader aspects. For example crosspoint switch 10 could be easily modified to employ using more than two memory banks A and B or to employ a larger switch array 12. The rapid connect input to memory interface circuit 16 may be through dedicated terminals other than switch terminals T48–T63, and address decoder 44 may be configured to provide various addressing modes in addition to the illustrated nibble, byte and word modes. Also the BANK signal, instead of being a separate input to switch 10, could alternatively be controlled by the host controller via an additional bit stored in shift register 23. However in such case, switching multiplexer 13 would require transmission of several bits on the serial bus. The A/B and/or the S1/2 control signals produced by bits stored in shift register 23 could alternatively be directly supplied by an external controller to dedicated inputs of the crosspoint switch. The appended claims therefore are intended to cover all such modifications as fall within the true scope and spirit of the invention.

What is claimed is:

1. An apparatus for interconnecting selected pairs of a plurality of terminals and conveying data signals therebetween, the terminal pairs being selected according to alternative first and second interconnection patterns respectively defined by first and second pattern data from an external host controller, the apparatus comprising:

switch means for interconnecting said selected pairs of terminals and conveying said data signals therebetween, said switch means selecting the terminal pairs according to a selection pattern determined by input switch control signals wherein said switch means comprises a plurality of switches, each of said input switch control signals being applied as input to a separate one of said switches, each switch interconnecting a unique pair of said terminals in response to its input switch control signal;

a first memory bank for storing said first pattern data from said host controller and producing first switch control signals representing its stored first pattern data;

a second memory bank for storing said second pattern data from said host controller and producing second switch control signals representing its stored second pattern data;

memory controller means for receiving said first pattern data from said host controller and writing said first pattern data into said first memory bank, and for receiving said second pattern data from said host controller and writing said second pattern data into said second memory bank; and selection means for applying said first or second switch control signals as said input switch control signals to said switch means.

2. The apparatus in accordance with claim 1 wherein said selection means includes a control input for receiving a bank switch signal from an external source, and wherein the bank switch signal indicates which of the first and second switch control signals is to be applied as said input switch control signals to said switch means.

3. An apparatus for interconnecting selected pairs of a plurality of terminals and conveying data signals therebetween, the terminal pairs being selected according to programming data and bank selection data from an external host controller, the apparatus comprising:

switch means for interconnecting said selected pairs of terminals and conveying said data signals therebetween, said switch means selecting the terminal pairs according to a selection pattern determined by input switch control signals wherein said switch means comprises a plurality of switches, each of said input switch control signals being applied as input to a separate one of said switches, each switch interconnecting a unique pair of said terminals in response to its input switch control signal;

a first memory bank having addresses for storing first pattern data and producing a first set of switch control signals representing its stored first pattern data;

a second memory bank having addresses for storing second pattern data and producing a second set of switch control signals set representing its stored second pattern data; and controller means for receiving said programming and bank selection data from said host controller, said programming data including input pattern data and addressing data, for selectively writing said input pattern data into one of said first and second memory banks at an address indicated by said addressing data, the controller means selecting the one bank in response to said bank selection data, and for conveying one set of said first and second sets of switch control signals as said input switch control signals to said switch means, the controller means selecting the one set in response to said bank selection data.

4. The apparatus in accordance with claim 3 wherein said controller means comprises:

parallel interface means for receiving first programming data from said host controller in a parallel form, for storing the received first programming data, said first programming data including first pattern data and first addressing data;

serial interface means for receiving second programming data from said host controller in a serial form, for storing the received second programming data, said second programming data including second pattern data and second addressing data, for receiving the bank selection data from said host computer in serial form, and for storing the received bank selection data;

first decoder means for reading and decoding the stored first addressing data to produce first addressing signals indicating at least one address in one of said first and second memory banks at which the stored first pattern data is to be written;

second decoder means for reading and decoding the stored second addressing data to produce second addressing signals indicating at least one address in one of said first and second memory banks at which the stored second pattern data is to be written; and memory control means receiving said first addressing signals from said first decoder means, receiving said second addressing signals from second decoder means, and receiving the stored bank selection data from said serial interface means, for selectively writing said first input pattern data into one of said first and second memory banks at least one address indicated by said first addressing signals, for selectively writing said second input pattern data into one of said first and second memory banks at an address indicated by said second addressing signals, and for conveying one set of said first and second sets of control signals, selected in response to said bank selection data, as said input switch control signals to said switch means.

5. The apparatus in accordance with claim 4 wherein a number of addresses indicated by said first addressing signals produced by said first decoder means is a variable function of said first addressing data.

6. An apparatus for routing signals between a set of terminals according to alternative routing patterns defined by routing data from a host controller comprising:

a plurality of pass transistors linking said terminals such that each pass transistor, when turned on, provides a signal path between a separate, unique pair of said terminals;

a plurality of memory banks, each memory bank storing routing data defining a separate one of said routing patterns and producing a separate set of output signals representing its stored data; and multiplexer means for selectively delivering an output signal from one of said plurality of memory banks to each of said pass transistors for controlling said pass transistors so that the pass transistors implement the routing pattern defined by the data in the selected memory bank, said multiplexer means having an input for receiving a control signal for controlling which one of said memory banks is selected.

7. An apparatus for routing signals between a set of terminals according to alternative routing patterns defined by routing data from a host controller comprising:

a plurality of pass transistors linking said terminals such that each pass transistor when turned on provides a signal path between a separate, unique pair of said terminals, and when turned off ceases to provide the signal path;

a plurality of sets of logic gates, each set of logic gates including more than one logic gate, each logic gate of each set having first and second control inputs and producing an output signal of state that is a logical combination of states of said first and second control inputs, the output signal of each logic gate being supplied to a corresponding one of said pass transistors and turning on and off the corresponding pass transistor in accordance with the state of the logic gate output signal;

a plurality of memory banks, each memory bank storing routing data defining a separate one of said routing patterns and producing separate first and second sets of output signals representing its stored data; and multiplexer means for delivering a separate signal of the first set of output signals of a selected one of said memory banks to the first input of each logic gate, and for delivering a separate signal of the second set of output signals of the selected one of said memory banks in parallel to the second input of each logic gate of a separate one of said sets of logic gates, said multiplexer means having an input for receiving a control signal for controlling which one of said memory banks is selected.

* * * * *